US011420411B2

(12) United States Patent
Taine

(10) Patent No.: US 11,420,411 B2
(45) Date of Patent: Aug. 23, 2022

(54) ELECTRO-ACTIVE POLYMER DEVICE AND METHOD FOR MANUFACTURING SUCH A DEVICE

(71) Applicant: SINGLE BUOY MOORINGS INC., Marly (CH)

(72) Inventor: Emmanuel Taine, Monaco (FR)

(73) Assignee: SINGLE BUOY MOORINGS INC., Marly (CH)

( * ) Notice: Subject to any disclaimer, the term of this patent is extended or adjusted under 35 U.S.C. 154(b) by 0 days.

(21) Appl. No.: 16/755,452

(22) PCT Filed: Oct. 10, 2018

(86) PCT No.: PCT/EP2018/077611
§ 371 (c)(1),
(2) Date: Apr. 10, 2020

(87) PCT Pub. No.: WO2019/072922
PCT Pub. Date: Apr. 18, 2019

(65) Prior Publication Data
US 2020/0238656 A1 Jul. 30, 2020

(30) Foreign Application Priority Data

Oct. 11, 2017 (EP) .................................. 17306374

(51) Int. Cl.
*B32B 5/16* (2006.01)
*B32B 9/00* (2006.01)
(Continued)

(52) U.S. Cl.
CPC ................ *B32B 5/16* (2013.01); *B32B 9/007* (2013.01); *B32B 27/14* (2013.01);
(Continued)

(58) Field of Classification Search
CPC B32B 5/16; B32B 9/007; B32B 27/14; H01L 23/5329
(Continued)

(56) References Cited

U.S. PATENT DOCUMENTS

2014/0313588 A1* 10/2014 Hong ....................... G02B 3/00
359/642
2017/0321176 A1* 11/2017 Kim .................... G01N 33/4833

FOREIGN PATENT DOCUMENTS

AU 2015202426 A1 * 5/2015
AU 2015202426 A1 5/2015
(Continued)

OTHER PUBLICATIONS

International Search Report, dated Oct. 10, 2018, from corresponding PCT application No. PCT/EP2018/077611.
(Continued)

*Primary Examiner* — Tahseen Khan
(74) *Attorney, Agent, or Firm* — Nixon & Vanderhye

(57) ABSTRACT

Disclosed is a method for manufacturing an electro-active polymer layer structure including an elastomer layer and at least one electrode layer that is arranged on a first surface of the dielectric elastomer layer, the method including: applying a layer of conductive material on the first surface of the elastomer layer. The layer of conductive material consists of agglomerated graphene based nanoplatelets, having a flattened shape between two main surfaces parallel to the graphene molecular lattice plane. The method further includes: obtaining a texture of the nanoplatelets in the applied layer by orienting the nanoplatelets on the first surface of the elastomer layer with the main surfaces of the nanoplatelets being parallel with the first surface of the
(Continued)

elastomer layer, such that the graphene molecular lattice plane of the nanoplatelets is parallel to the first surface of the elastomer layer.

15 Claims, 6 Drawing Sheets

(51) Int. Cl.
*B32B 27/14* (2006.01)
*H01L 23/532* (2006.01)

(52) U.S. Cl.
CPC .... *H01L 23/5329* (2013.01); *B32B 2264/108* (2013.01); *B32B 2307/204* (2013.01); *B32B 2307/514* (2013.01)

(58) Field of Classification Search
USPC ......................................................... 428/143
See application file for complete search history.

(56) References Cited

FOREIGN PATENT DOCUMENTS

| CN | 105792078 A | 7/2016 | |
|---|---|---|---|
| CN | 107167180 A | 9/2017 | |
| EP | 3219785 A1 | 9/2017 | |
| KR | 20160109539 A | 9/2016 | |
| WO | 2010/146457 A2 | 12/2010 | |
| WO | WO-2016076590 A1 * | 5/2016 | ............ C12M 21/08 |

OTHER PUBLICATIONS

Database WPI Week 201677; Thompson Scientific, London, GB; XP002779732; Corresponds to KR20160109539A; Sep. 21, 2016.
Database WPI Week 201655; Thompson Scientific, London, GB; XP002779727; Corresponds to CN105792078A; Jul. 20, 2016.
Database WPI Week 201772; Thompson Scientific, London, GB; XP002779731; Corresponds to CN107167180A; Sep. 15, 2017.

* cited by examiner

ELECTRO-ACTIVE POLYMER DEVICE AND METHOD FOR MANUFACTURING SUCH A DEVICE

FIELD OF THE INVENTION

The present invention relates to an electro-active polymer device. Also, the invention relates to a method for manufacturing such an electro-active polymer device.

PRIOR ART

Electro-mechanical energy conversion systems using an electro-active polymer (EAP) based device are for example disclosed in WO2010/146457.

Such an EAP based device comprises a dielectric elastomer carrier layer. On the surfaces of the dielectric elastomer layer electrode layers are arranged. The EAP based device can be considered as a variable capacitor of which the capacitance changes as a function of the amount of deformation exerted on a layer of EAP material. Due to an external force the electro-active polymer material can be stretched which causes that a distance between the electrode layers decreases. The distance increases again when the external force diminishes and the electro-active polymer layer relaxes.

By applying electrical charges on the capacitor at substantially the maximal deformation and removing the electrical charges at minimal deformation, energy can be harvested from the EAP based device.

Various types of electrode layers are known, comprising layers of metal, metal oxide, semiconductor, graphene, carbon nanotubes and combinations thereof.

Typically, electro-active polymer materials can be stretched to relatively high levels upto 80% or more of the original dimension. Metal layers in electro-active polymer materials show plastic deformation and cracking at relatively low stretch rates of the elastomer carrier layer and deteriorate strongly during a relatively low number of stretching cycles. For this reason, other conductive materials such as semiconductor, graphene, carbon nanotubes are the subject of research as candidates to replace metals as electrode layers.

It is an object of the present invention to provide an electro-active polymer material with graphene based electrode layers that provide stable mechanical and electrical performance during exposure to mechanical cycling with relatively high deformation.

SUMMARY OF THE INVENTION

The object is achieved by a method for manufacturing an electro active polymer layer structure comprising a dielectric elastomer layer and at least one electrode layer that is arranged on a first surface of the dielectric elastomer layer. The method comprises: providing the dielectric elastomer layer; applying a layer of conductive material on the first surface of the dielectric elastomer layer, wherein the layer of conductive material consists of agglomerated graphene based nanoplatelets, the nanoplatelets having a flattened shape between two main surfaces substantially parallel to the graphene molecular lattice plane; and wherein the method comprises: obtaining a texture of the graphene based nanoplatelets in the applied layer by orienting the graphene based nanoplatelets on the first surface of the dielectric elastomer layer with the main surfaces of the nanoplatelets being substantially parallel with said first surface of the dielectric elastomer layer, such that the graphene molecular lattice plane of the nanoplatelets is substantially parallel to said first surface of the dielectric elastomer layer.

Advantageously, the method provides the graphene based nanoplatelets obtain a substantially desirable orientation with respect to the stretching direction of the electro-active polymer material, which causes a reduction in electrical resistivity of the electrode layers and additionally a mechanically stable arrangement of the graphene based nanoplatelets within the electrode layer. As a result, the electrode layers of the invention are more durable.

According to an aspect, the method further comprises: exposing the electro-active polymer layer structure to a cyclic mechanical force by repeatedly straining of the electro-active polymer layer structure in a direction substantially parallel to the plane of the first and second surfaces and subsequently relaxing of the electro-active polymer layer structure.

It is observed that the sheet resistivity of the graphene based electrode layer that is exposed to this cyclical straining and relaxing, approaches a steady state value after some cycles.

Since the sheet resistivity of the electrode layers is related to the distribution and orientation of the graphene based nanoplatelets in the electrode layers, the exposure of the electro-active polymer layer structure to cyclic straining beneficially enhances the preferred texture of the electrode layers along the surface of the dielectric elastomer layer and along the straining direction.

Advantageous embodiments are further defined by the dependent claims.

BRIEF DESCRIPTION OF DRAWINGS

The invention will be explained in more detail below with reference to drawings in which illustrative embodiments thereof are shown. The drawings are intended exclusively for illustrative purposes and not as a restriction of the inventive concept. The scope of the invention is only limited by the definitions presented in the appended claims.

DETAILED DESCRIPTION OF EMBODIMENTS

Figure 1A:
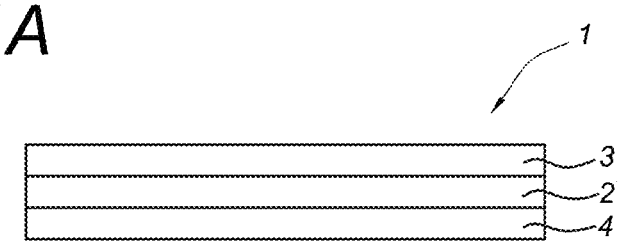
FIG. 1A, 1B show a cross-section of an electro-active polymer layer structure.
Figure 1B:
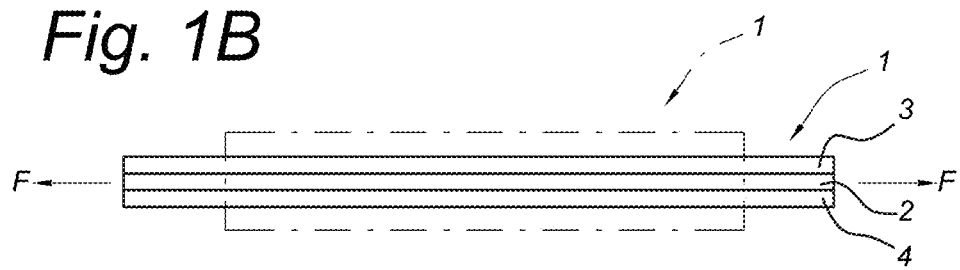

FIG. 1A, 1B show a cross-section of an electro-active polymer layer structure.

In FIG. 1A a cross-section of an electro-active polymer layer structure 1 is shown which comprises a dielectric elastomer layer 2 sandwiched in between two electrode layers 3, 4. The electro-active polymer layer structure can function as a variable capacitor.

As shown in FIG. 1B, if a tensile force F is applied to the electro-active polymer layer structure 1 in a direction parallel to the plane of the layer 2, the dielectric elastomer layer 2 are stretched and the electrodes are forced to follow the stretched dielectric elastomer. For comparison, the electro-active polymer layer structure in unstrained state is shown by a dashed contour line.

Due to the force F, the dielectric elastomer layer will contract in direction perpendicular on the stretching direction and the thickness of the dielectric elastomer layer thus diminishes. As a result, the distance between the two electrode layers reduces as well and the capacitance of the electro-active polymer layer structure increases. When the force F is removed, the dielectric elastomer layer relaxes and returns to its original thickness and dimensions. The capacitance reduces accordingly. Based on this principle, the electro-active polymer layer structure can be used for transforming mechanical energy to electric energy and vice versa when a voltage is applied on the electrode layers (see for example, PCT/EP2013/059463, owned by Applicant).

Figure 2:
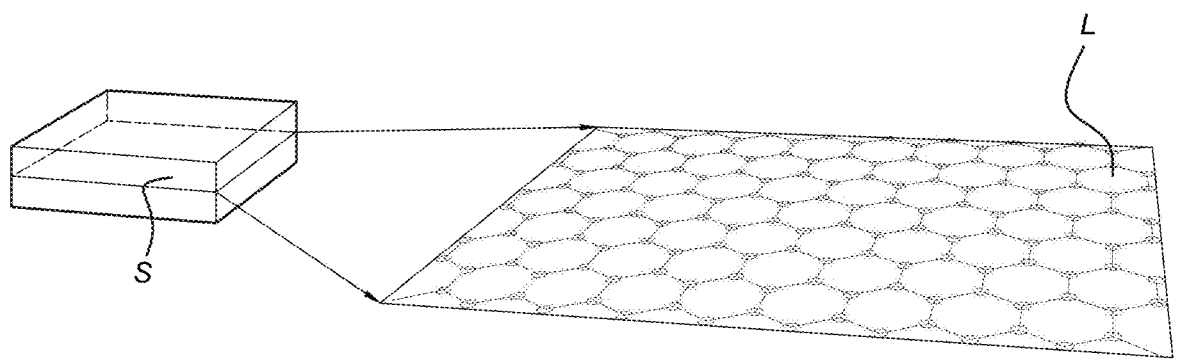
FIG. 2 shows a schematic representation of a material forming an electrode layer of the electro-active polymer layer structure, in accordance with an embodiment of the invention.

FIG. 2 shows a schematic representation of a material forming an electrode layer of the electro-active polymer layer structure, in accordance with an embodiment of the invention.

According to the invention, the electro-active polymer layer structure has at least one electrode layer of a material which comprises graphene based nanoplatelets.

Such graphene based nanoplatelets have typically a flattened shape like flakes or platelets between two substantially parallel main surfaces, depicted here schematically as a rectangular block S.

Graphene material is a carbon based substance which has a crystallographic two-dimensional hexagonal carbon lattice denoted here as "graphene molecular lattice" L and depicted here schematically in relation to its orientation in the graphene based nanoplatelets. Graphene particles are composed of at least a single one "graphene molecular lattice" L or a layered structure of a stack of plural "graphene molecular lattices".

Due to the layered structure of graphene based nanoplatelets, the "graphene molecular lattice" extends parallel to, is coplanar with, the main surfaces of the nanoplatelet. Graphene is electrically conductive in directions along the graphene molecular lattice plane.

Figure 3:
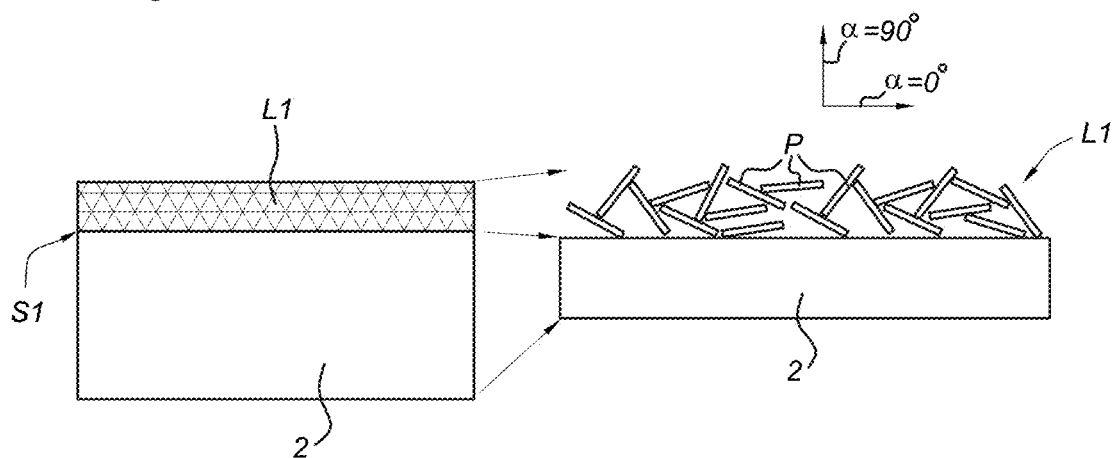
FIG. 3 shows a cross-section of an electro-active polymer layer structure during a first stage of manufacturing.

FIG. 3 shows a cross-section of an electro-active polymer layer structure during a first stage of manufacturing in accordance with an embodiment of the invention.

During the manufacturing, a layer L1 of graphene based nanoplatelets P is applied on at least one surface S1 of the dielectric elastomer layer 2. Due to the plate-like shape of the graphene based nanoplatelets, after application the orientation of the platelets P with respect to the surface S1 of the dielectric elastomer layer 2 is random, with an angle $\alpha$ between the orientation of the graphene molecular lattice and the surface of the dielectric elastomer layer varying between perpendicular ($\alpha \approx 90°$) and parallel ($\alpha \approx 0°$) directions. The distribution of the graphene based nanoplatelets is schematically shown in the inset of FIG. 3. It is noted that conductivity along the surface of the dielectric elastomer layer tends to be poor for such a random distribution of the platelets P.

If required, a removable mask can be arranged on the dielectric elastomer layer before applying the layer of graphene based nanoplatelets. In this manner the graphene based nanoplatelets layer can be patterned.

It will be appreciated that contact electrodes (not shown) can be created on the surface of the dielectric elastomer layer, to provide external contact terminals to the graphene based nanoplatelets layer as electrical connections. Preferably, the electrical connections are created on the dielectric elastomer layer before the layer of graphene based nanoplatelets is applied. For example, the electrical connections can be evaporated, printed or painted on the dielectric elastomer layer. It may also be feasible to create or apply the electrical connections later.

Figure 4:
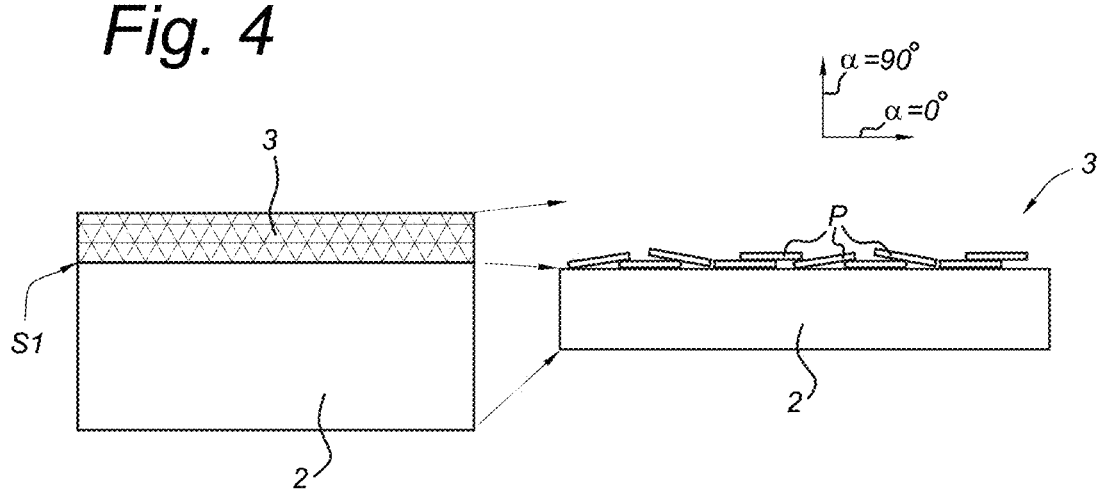
FIG. 4 shows a cross-section of an electro-active polymer layer structure during a further stage of manufacturing.

FIG. 4 shows a cross-section of an electro-active polymer layer structure during a second or further stage of manufacturing.

In a subsequent step, the method comprises that the electrode layer L1 becomes textured, that is to say, the platelets become preferentially oriented with the plane of the graphene molecular lattice L being substantially parallel to the surface S1 of the dielectric elastomer layer along direction $\alpha \approx 90$. The step of obtaining a textured layer 3 of graphene based nanoplatelets is carried out by working the layer with a spreading tool which relatively moves over the applied layer L1 of graphene based nanoplatelets while a pressure is exerted on the graphene based nanoplatelets containing surface that is in contact with the spreading tool. It will be appreciated that alternatively the spreading tool is static and the dielectric layer including the layer of graphene based nanoplatelets material moves with regard to the spreading tool.

As a result of the working, the platelets P are arranged with their main surfaces parallel to the surface of the dielectric elastomer layer. Also, the platelets are stacked on top of each other forming interconnections parallel with the surface of the dielectric elastomer layer. Advantageously, this structure of the graphene based nanoplatelets in the electrode layer provides that a continuous conductive path is available along the surface of the dielectric elastomer layer. The distribution of the platelets is schematically shown in the inset of FIG. 4.

After the working any free or excess graphene material is removed which leaves an adhered graphene layer on the dielectric elastomer layer. The adhered graphene layer has a thickness of at least about 5 nm upto about 2-10 µm.

The working may cause that the graphene based nanoplatelets become substantially aligned with their longitudinal axis parallel to the direction of the working by the spreading tool.

FIGS. 5A-5E schematically show tools for working the graphene based nanoplatelets layer in accordance with embodiments of the invention.

Figure 5A:
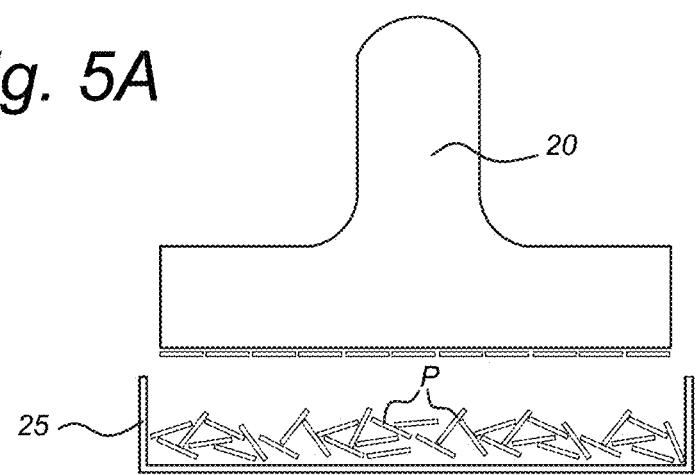
FIGS. 5A-5E schematically show tools for working the graphene based nanoplatelets layer in accordance with embodiments of the invention.
Figure 5B:
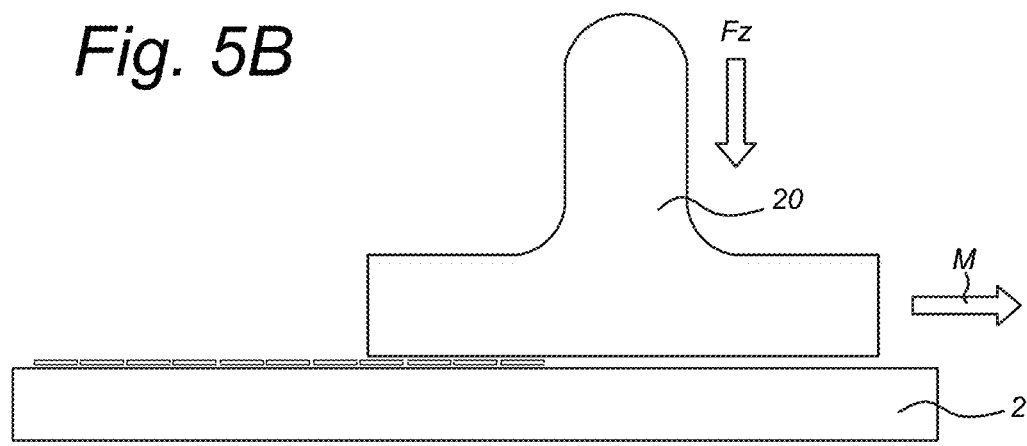

FIGS. 5A and 5B schematically show a flat stamp tool 20 for applying the graphene based nanoplatelets. The stamp tool has a flat working surface. During a first stage, the flat working surface is exposed to a powder of graphene based nanoplatelets P in such manner that the working surface collects a layer of graphene based nanoplatelets. As shown in FIG. 5B, during a next stage, the working surface of the flat stamp tool 20 is pressed with pressure Fz on the surface of the dielectric elastomer layer 2 to bring the graphene based nanoplatelets into contact with the dielectric elastomer layer. Subsequently, the flat stamp tool 20 is moved in direction M along the surface of the dielectric elastomer layer to transfer the graphene based nanoplatelets to the surface of the dielectric elastomer layer. During the movement of the flat stamp tool, the pressure Fz is maintained. Next, the stamp tool is removed from the surface of the dielectric elastomer layer.

Figure 5C:
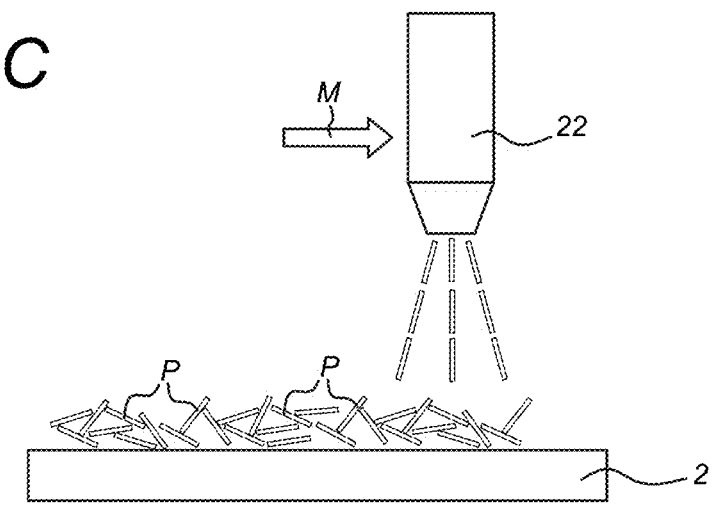

FIG. 5C shows schematically a tool 22 for applying graphene based nanoplatelets on the surface of the dielectric elastomer layer. The application tool 22 can be a spray gun or a spreader. The spray gun is configured to spray a suspension containing liquid and graphene based nanoplatelets P, while moving in direction M. The spreader is configured for scattering a powder of graphene based nanoplatelets P.

If a suspension is used to apply a layer of graphene based nanoplatelets on the dielectric elastomer layer, the liquid is removed by evaporation before the step of orienting the graphene based nanoplatelets.

Figure 5D:
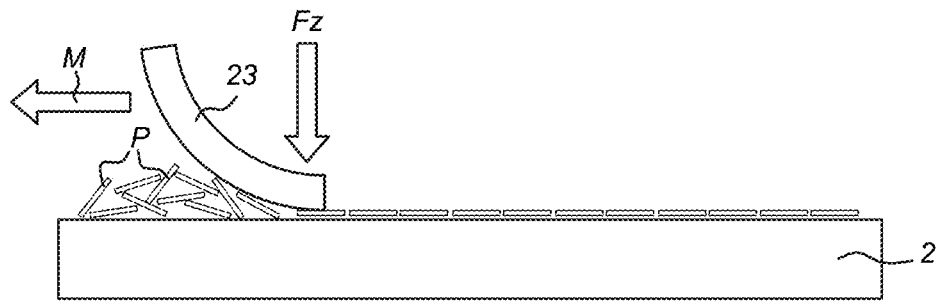

FIG. 5D shows schematically a scraper or spreading tool 23 for orienting the graphene based nanoplatelets P along the surface of the dielectric elastomer layer after the graphene based nanoplatelets have been applied (via spraying, spreading, etc.) onto the dielectric elastomer layer 2.

By moving an edge of the scraper 23 along the surface over the applied layer of graphene based nanoplatelets, the scraper exerts some pressure Fz on the nanoplatelets, which causes the nanoplatelets to become aligned with the surface with the main surfaces of the nanoplatelets substantially parallel with the surface of the dielectric elastomer layer, such that, overall, the graphene molecular lattice plane of the nanoplatelets is substantially parallel to the surface.

Figure 5E:
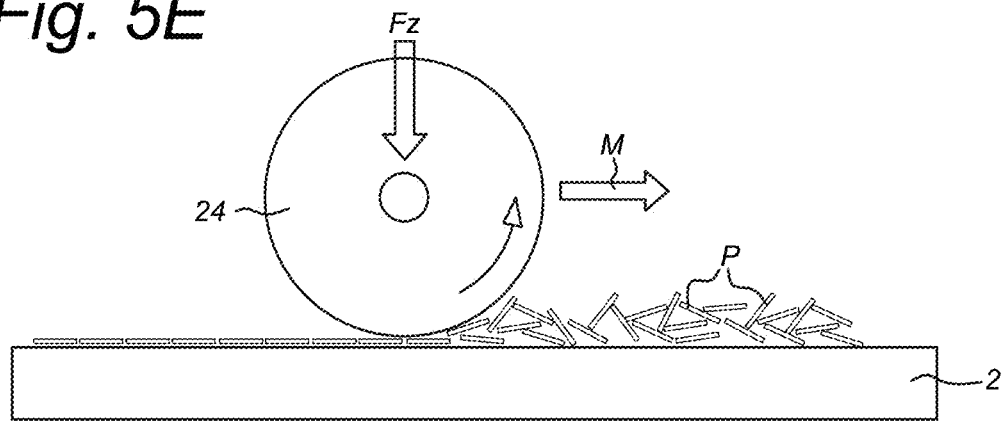

FIG. 5E shows schematically a rotating cylinder 24 for orienting the graphene based nanoplatelets P. The rotating cylinder is positioned on the applied layer with its rotation axis parallel to the surface. For orienting the graphene based nanoplatelets in the applied layer, the cylinder 24 is relatively moving in direction M along the surface while rotating in counterdirection and exerting some pressure Fz on the surface of the applied layer.

Alternatively, the dielectric elastomer with the applied layer of graphene based nanoplatelets on top of it, can be moved relatively to a fixed roll, scraper or spreading tool to have the same effect of orientating the graphene based nanoplatelets by pressure Fz with regard to the surface of the dielectric elastomer.

An additional effect is that by pre-orientation of the graphene based nanoplatelets under a certain pressure and direction, air trapped between the graphene based nanoplatelets is removed as well so that the graphene based nanoplatelets layer becomes denser. When another dielectric layer or protective layer is added onto the compact pre-orientated layer of graphene based nanoplatelets, less air is trapped between the layers; for example in case a liquid silicone layer is added directly on top the graphene layers, less or no air bubbles are trapped in the silicone layer after cross-linking.

Figure 6A:
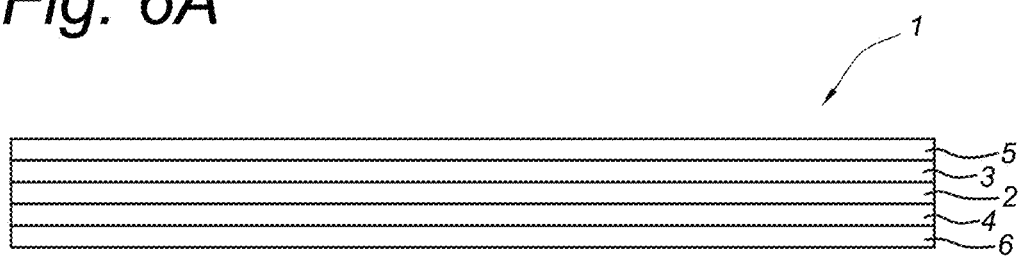
FIG. 6 shows a cross-section of an electro-active polymer layer structure according to an embodiment of the invention.
Figure 6B:
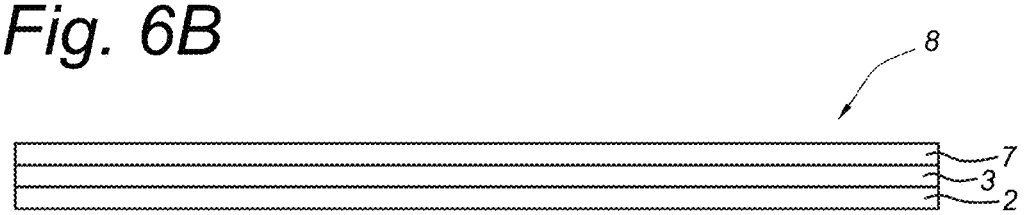

FIGS. 6A and 6B show a cross-section of an electro-active polymer layer structure according to a respective embodiment of the invention.

In an embodiment as shown in FIG. 6A, the electro-active polymer layer structure comprises a stack of layers. A dielectric elastomer layer 2 is arranged as carrier layer. On a first surface of the dielectric elastomer layer a first graphene based nanoplatelets layer 3 is arranged, which is covered by a first cover elastomer layer 5. On a second surface of the dielectric elastomer layer, opposite of the first surface, a second graphene based nanoplatelets layer 4 is arranged, which is covered by a second cover elastomer layer 6.

Other layers may be present such as contacting electrode layers (not shown) that each contacts one of the first and second graphene based nanoplatelets layers.

In an embodiment as shown in FIG. 6B, the electro-active polymer layer structure consists of a dielectric elastomer layer 2 and one graphene based nanoplatelets layer 3, in which on a first surface of the dielectric elastomer layer 2 the one graphene based nanoplatelets layer 3 is arranged. Optionally, the one graphene based nanoplatelets layer is covered by a cover elastomer layer 7.

Figure 7A:
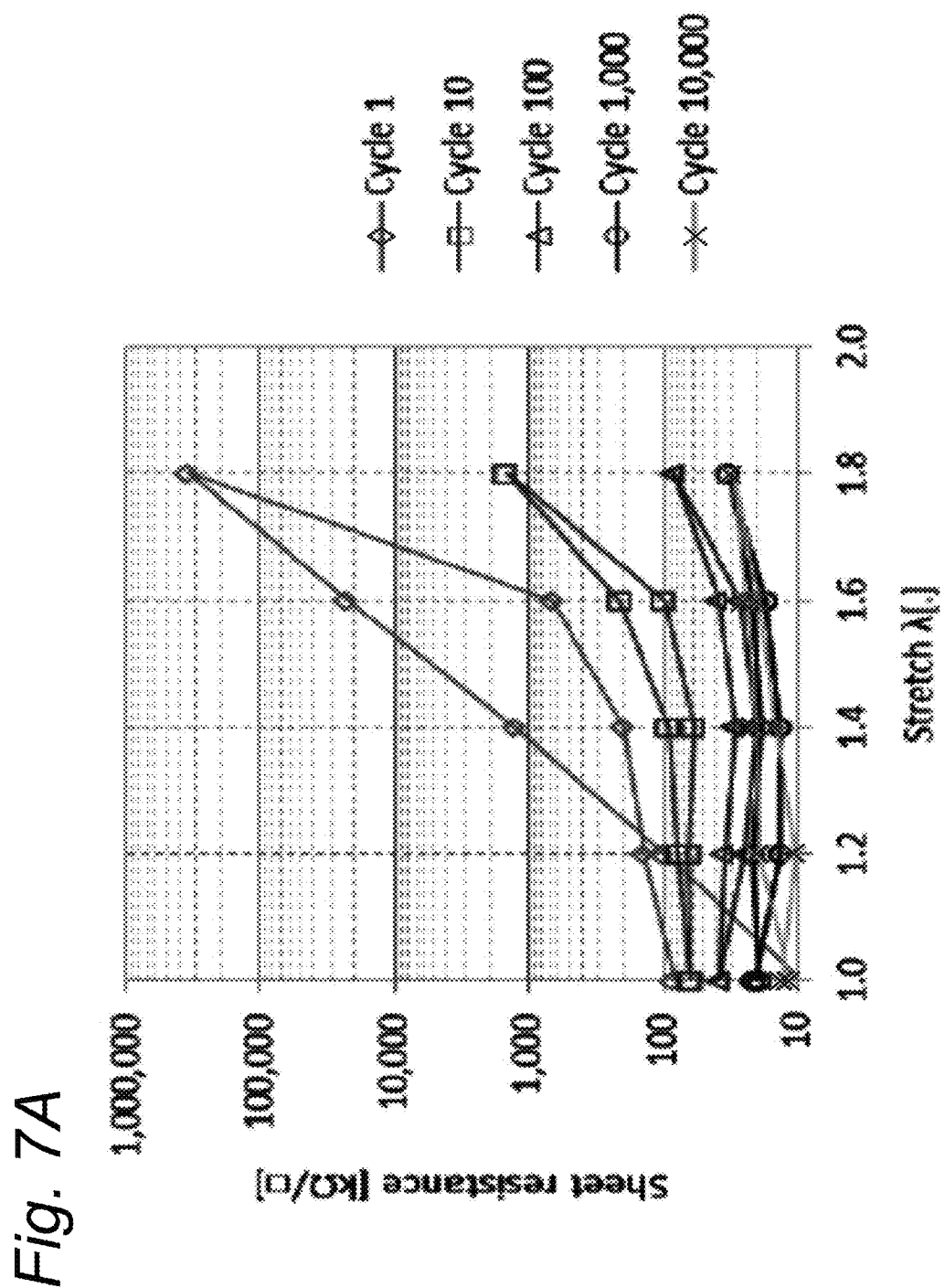
FIGS. 7A and 7B show examples of the resistivity of the electrode layer of an electro-active polymer layer structure according to an embodiment of the invention, as a function of mechanical strain and of a number of straining cycles, respectively.
Figure 7B:
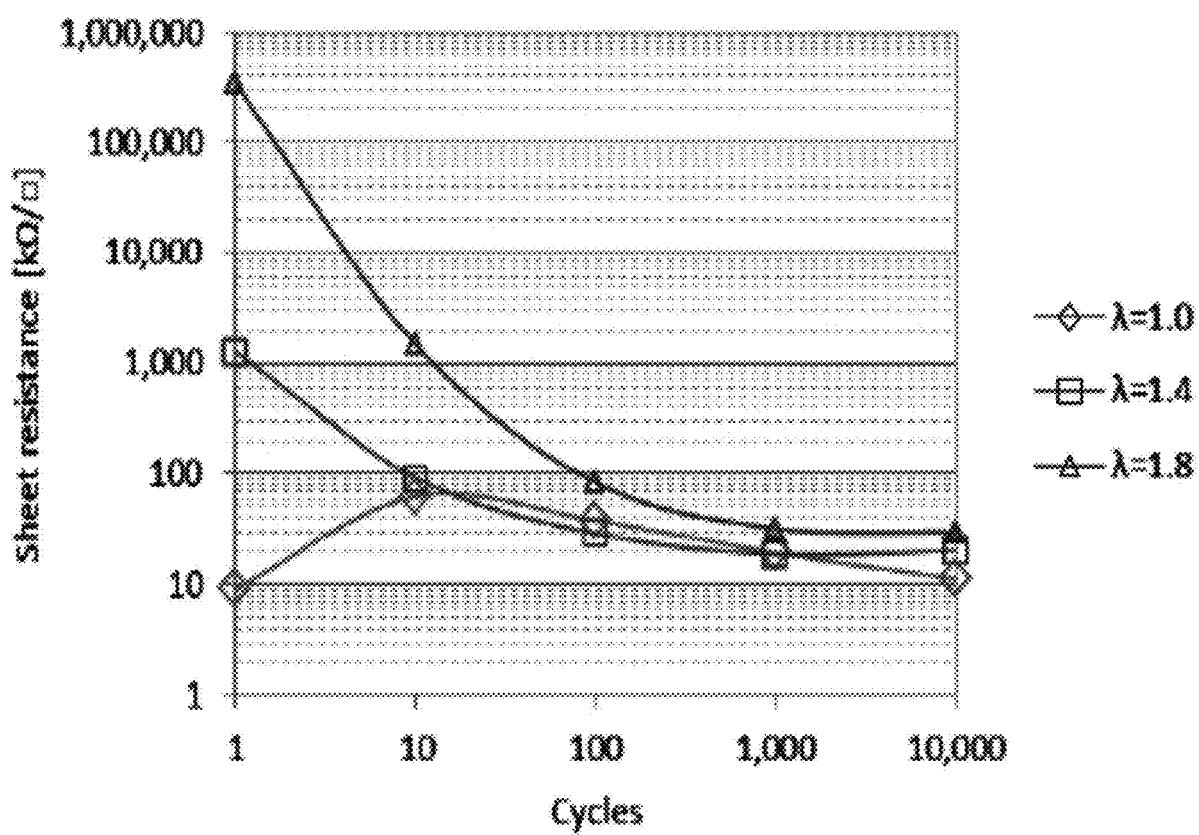

FIGS. 7A and 7B show the resistivity of the electrode layer according to an embodiment of the invention, as a function of mechanical strain and of a number of straining cycles, respectively.

After creating the electro-active polymer layer structure as shown schematically in FIG. 6A or 6B, the electro-active polymer layer structure can be exposed to a (periodically) varying mechanical force that is substantially parallel to the plane of the first and second surfaces, which causes the electro-active polymer layer structure to cyclically strain and relax. If applied, this cycle is repeated at least once after the layer of graphene based nanoplatelets has been oriented with respect to the dielectric elastomer by the spreading tool 22; 23; 24 or flat stamp tool 20.

It is observed that the sheet resistivity of the graphene based electrode layer that is exposed to this cycle, approaches a steady state value after some cycles.

In FIG. 7A, the sheet resistivity is shown as function of elastic strain $\lambda$ for cycle 1, cycle 10, cycle 100, cycle 1,000 and cycle 10,000. The elastic strain $\lambda$ is defined as the ratio of the strained length and the relaxed (i.e., not strained) length of the electro-active polymer layer structure.

FIG. 7B shows the sheet resistivity of the electro-active polymer layer structure as function of the number of cycles, for elastic strain of 0%, 40% and 80% $\lambda=1.0$, $\lambda=1.4$ and $\lambda=1.8$, respectively. From the plot it can be derived that the resistivity approaches a substantially constant value for larger numbers of cycles.

Since the sheet resistivity of the electrode layers is related to the distribution and orientation of the graphene based nanoplatelets in these layers, from FIGS. 7A and 7B it can be concluded that the exposure of the electro-active polymer layer structure to cyclic straining may beneficially enhance the preferred texture of the electrode layers along the surface of the dielectric elastomer layer and along the straining direction.

It is considered that mechanical cycling enhances the orientation of the graphene based nanoplatelets in the straining direction and enhances the alignment and stacking of the contact surfaces between graphene based nanoplatelets so that the initial friction between the graphene based nanoplatelets as well as between the different layers of graphene based nanoplatelets is reduced as a result of the cyclic straining and relaxing. In addition, the cyclic straining may beneficially enhance the densification of the graphene based nanoplatelets layer by reduction of open space inbetween platelets.

It is noted that the elastic strain $\lambda$ can be upto $\lambda \approx (=160\%$ strain) depending on the dielectric elastomer layer material. Also, the elastic strain to which the dielectric elastomer layer is exposed to during the cyclic straining may depend on an actual application. The dielectric elastomer layer may be exposed to a cyclic straining that is substantially similar to or exceeds straining conditions as encountered in the actual application. If the electro-active polymer layer structure is to be used in practice upto a maximal operating strain, then the cyclic straining during the manufacturing should reach at least the maximal operating strain or exceed that. For example, if the maximal operation strain is 40%, the cyclic straining should reach the 40% level or exceed that upto for example a 50 or 60% strain level.

In an embodiment, after obtaining the texture, a thickness of the graphene based nanoplatelets layer is at least 5 nm.

In a further embodiment, after obtaining the texture, a thickness of the graphene based nanoplatelets layer is at least about 2 μm.

In an Embodiment, the Graphene Based Nanoplatelets have a Characteristic Lateral Size of at Least about 1 μm, and a Thickness of at Least about 5 nm.

In an embodiment, the graphene based nanoplatelets may have a specific surface area of at least 15 $m^2/g$.

In an embodiment, the dielectric elastomer layer consists of a silicone, such as polydimethylsiloxane, or a polyisoprene, or a polybutadiene.

In an embodiment, a thickness of the dielectric elastomer layer is at least about 40 μm.

The invention has been described with reference to some embodiments. Obvious modifications and alterations will occur to others upon reading and understanding the preceding detailed description. It is intended that the invention be construed as including all such modifications and alterations insofar as they come within the scope of the appended claims.

In particular, combinations of specific features of various aspects of the invention may be made. An aspect of the invention may be further advantageously enhanced by adding a feature that was described in relation to another aspect of the invention.

In this document and in its claims, the verb "to comprise" and its conjugations are used in their non-limiting sense to mean that items following the word are included, without excluding items not specifically mentioned. In addition, reference to an element by the indefinite article "a" or "an" does not exclude the possibility that more than one of the element is present, unless the context clearly requires that there be one and only one of the elements. The indefinite article "a" or "an" thus usually means "at least one".

Also, reference to an element by a cardinal or ordinal number does not exclude the possibility that more than the indicated number of the element is present, unless the context clearly requires that there be only the indicated number.

In addition, modifications may be made to adapt a material or substance of the electro-active polymer layer structure to the teachings of the invention without departing from the essential scope thereof. The graphene material and/or the dielectric elastomer material as described above may encompass variants or modifications in structure or composition.

The invention claimed is:

1. A method for manufacturing an electro-active polymer layer structure including a dielectric elastomer layer and at least one electrode layer that is disposed on a first surface of the dielectric elastomer layer, the method comprising:
   providing the dielectric elastomer layer;
   applying a layer of conductive material on the first surface of the dielectric elastomer layer, the layer of conductive material consisting of agglomerated graphene-based nanoplatelets, the graphene-based nanoplatelets having a flattened shape between two main surfaces substantially parallel to a graphene molecular lattice plane;
   obtaining a texture of the graphene-based nanoplatelets in the applied layer by orienting the graphene-based nanoplatelets on the first surface of the dielectric elastomer layer with the main surfaces of the nanoplatelets being substantially parallel with said first surface of the dielectric elastomer layer, such that the graphene molecular lattice plane of the nanoplatelets is substantially parallel to said first surface of the dielectric elastomer layer; and
   exposing the electro-active polymer layer structure a cyclic mechanical force by repeatedly straining the electro-active polymer layer structure in a direction substantially parallel to the plane of the first and second surfaces and subsequently relaxing the electro-active polymer layer structure.

2. The method according to claim 1, further comprising:
   applying a second layer of graphene-based nanoplatelets on a second surface of the dielectric elastomer layer opposite to the first surface; and
   obtaining a texture of the graphene-based nanoplatelets in the applied second layer by orienting the graphene based nanoplatelets on the second surface of the dielectric elastomer layer with the main surfaces of the nanoplatelets being substantially parallel with said second surface.

3. The method according to claim 1, wherein the orienting the graphene-based nanoplatelets is done by a process comprising:
   positioning a spreading tool on the applied layer of graphene-based nanoplatelets and displacing the spreading tool and layers of graphene-based nanoplatelets relatively with regard to each other so that the spreading tool is moving across the respective surface of the dielectric elastomer layer, the spreading tool being selected from one of a scraper, a spreader, a doctor blade, and a rotating cylinder, and
   applying a pressure on the applied layer by the spreading tool during the relative displacement of the spreading tool across the respective surface of the dielectric elastomer layer.

4. The method according to claim 1, wherein the applying the layer of graphene-based nanoplatelets is carried out by a process selected from:
   spraying a solution of graphene-based nanoplatelets in a solvent on the respective surface and drying the solution, and
   scattering a graphene-based nanoplatelets powder on the respective surface.

5. The method according to claim 1, wherein the applying the layer of graphene-based nanoplatelets and the orienting the graphene-based nanoplatelets are carried out by a stamping process using a flat stamp, the stamping process comprising:
   collecting a layer of graphene-based nanoplatelets on a working surface of the flat stamp,
   pressing the collected layer of graphene-based nanoplatelets on the respective surface of the dielectric elastomer layer by the working surface, and
   relatively moving the working surface along the respective surface of the dielectric elastomer layer transfer the pressed layer of graphene-based nanoplatelets, and subsequently lifting the working surface from the dielectric elastomer layer.

6. The method according to claim 1, further comprising creating electrical connections on the respective surface to contact the pre-oriented graphene-based nanoplatelets layer.

7. The method according to claim 1, further comprising creating a cover elastomer layer on top of the respective oriented graphene-based nanoplatelets layer.

8. The method according to claim 7, wherein said creating the cover elastomer layer comprises
- covering the oriented graphene-based nanoplatelets layer with a layer of liquid elastomer pre-cursor, and
- curing the layer of liquid elastomer pre-cursor to form the cover elastomer layer.

9. The method according to claim 1, further comprising measuring an electrical resistivity of the oriented graphene-based nanoplatelets layer and continuing cycling until the electrical resistivity reaches a steady-state threshold level.

10. The method according to claim 1, wherein the applied strain is between zero and at least 80 percent.

11. The method according to claim 2, wherein the orienting the graphene-based nanoplatelets is done by a process comprising:
- positioning a spreading tool on the applied layer of graphene-based nanoplatelets and displacing the spreading tool and layers of graphene-based nanoplatelets relatively with regard to each other so that the spreading tool is moving across the respective surface of the dielectric elastomer layer, the spreading tool being selected from one of a scraper, a spreader, a doctor blade, and a rotating cylinder, and
- applying a pressure on the applied layer by the spreading tool during the relative displacement of the spreading tool across the respective surface of the dielectric elastomer layer.

12. The method according to claim 2, wherein the applying the layer of graphene-based nanoplatelets is carried out by a process selected from:
- spraying a solution of graphene-based nanoplatelets in a solvent on the respective surface and drying the solution, and
- scattering a graphene-based nanoplatelets powder on the respective surface.

13. The method according to claim 3, wherein the applying the layer of graphene-based nanoplatelets is carried out by a process selected from:
- spraying a solution of graphene-based nanoplatelets in a solvent on the respective surface and drying the solution, and
- scattering a graphene-based nanoplatelets powder on the respective surface.

14. The method according to claim 2, wherein the applying the layer of graphene-based nanoplatelets and the orienting the graphene-based nanoplatelets are carried out by a stamping process using a flat stamp, the stamping process comprising:
- collecting a layer of graphene-based nanoplatelets on a working surface of the flat stamp,
- pressing the collected layer of graphene-based nanoplatelets on the respective surface of the dielectric elastomer layer by the working surface, and
- relatively moving the working surface along the respective surface of the dielectric elastomer layer transfer the pressed layer of graphene-based nanoplatelets, and subsequently lifting the working surface from the dielectric elastomer layer.

15. The method according to claim 3, wherein the applying the layer of graphene-based nanoplatelets and the orienting the graphene-based nanoplatelets are carried out by a stamping process using a flat stamp, the stamping process comprising:
- collecting a layer of graphene-based nanoplatelets on a working surface of the flat stamp,
- pressing the collected layer of graphene-based nanoplatelets on the respective surface of the dielectric elastomer layer by the working surface, and
- relatively moving the working surface along the respective surface of the dielectric elastomer layer to transfer the pressed layer of graphene-based nanoplatelets, and subsequently lifting the working surface from the dielectric elastomer layer.

\* \* \* \* \*